United States Patent
Kohno et al.

(10) Patent No.: US 6,566,150 B2
(45) Date of Patent: May 20, 2003

(54) SEMICONDUCTOR DEVICE AND MANUFACTURING METHOD THEREOF INCLUDING A PROBE TEST STEP AND A BURN-IN TEST STEP

(75) Inventors: Ryuji Kohno, Ibaraki-ken (JP); Tetsuo Kumazawa, Ibaraki-ken (JP); Makoto Kitano, Tsuchiura (JP); Akihiko Ariga, Musashimurayama (JP); Yuji Wada, Tachikawa (JP); Naoto Ban, Sagamihara (JP); Shuji Shibuya, Sayama (JP); Yasuhiro Motoyama, Kodaira (JP); Kunio Matsumoto, Yokohama (JP); Susumu Kasukabe, Yokohama (JP); Terutaka Mori, Urayasu (JP); Hidetaka Shigi, Kanagawa-ken (JP); Takayoshi Watanabe, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/171,695

(22) Filed: Jun. 17, 2002

(65) Prior Publication Data

US 2002/0182796 A1 Dec. 5, 2002

Related U.S. Application Data

(63) Continuation of application No. 09/653,624, filed on Aug. 31, 2000, which is a continuation of application No. 09/157,153, filed on Sep. 18, 1998, now Pat. No. 6,197,603.

(30) Foreign Application Priority Data

Sep. 18, 1997 (JP) ............................................. 9-253006

(51) Int. Cl.⁷ ......................... G01R 31/26; H01L 21/66; H01L 21/00; H01L 21/44; H01L 21/301
(52) U.S. Cl. ............................. 438/14; 438/17; 438/33; 438/113; 438/460
(58) Field of Search ........................... 438/14, 113, 17, 438/33, 460

(56) References Cited

U.S. PATENT DOCUMENTS

| | | | |
|---|---|---|---|
| 5,510,724 A | | 4/1996 | Itoyama et al. |
| 5,623,214 A | * | 4/1997 | Pasiecznik, Jr. ............ 324/754 |
| 5,848,467 A | | 12/1998 | Khandros et al. |
| 5,998,228 A | | 12/1999 | Eldridge et al. |
| 6,051,982 A | * | 4/2000 | Alcoe et al. ................ 324/754 |
| 6,084,420 A | * | 7/2000 | Chee ......................... 324/754 |

FOREIGN PATENT DOCUMENTS

| | | |
|---|---|---|
| JP | 09-005355 | 1/1997 |
| JP | 09-051022 | 2/1997 |

OTHER PUBLICATIONS

Nippon Avionics Co., Ltd. (Packard Huges) Catalog, 1993.
Hoya Probe Technology Membrane Probe Card Catalog, 1985.

* cited by examiner

Primary Examiner—John F. Niebling
Assistant Examiner—Ron Pompey
(74) Attorney, Agent, or Firm—Antonelli, Terry, Stout & Kraus, LLP

(57) ABSTRACT

Dispersion of load may be kept within an allowance even when a plurality of probes in a large area are pressed in batch by pressing the probes provided in a membrane to a wafer by applying a pressure load to a plurality of places of a plane of pressure members on the side opposite from the wafer in a probe test step/burn-in test step which is one of semiconductor device manufacturing steps. It is then possible to provide semiconductor devices and a manufacturing method thereof which enhance the reliability and productivity of the semiconductor devices by probing a large number of integrated circuits or a large size integrated circuit in the same time.

1 Claim, 16 Drawing Sheets

SEMICONDUCTOR DEVICE AND MANUFACTURING METHOD THEREOF INCLUDING A PROBE TEST STEP AND A BURN-IN TEST STEP

This is a continuation of application Ser. No. 09/653,624, filed Aug. 31, 2000; which is a continuation of Ser. No. 09/157,153, filed Sep. 18, 1998 (now U.S. Pat. No. 6,197,603), the entire disclosures of which are hereby incorporated by reference.

BACKGROUND OF THE INVENTION

The present invention relates to a semiconductor device and a method of manufacture thereof, and, more particularly, the invention relates to a semiconductor device and a manufacturing method which is designed to improve the yield of the semiconductor devices by improving the testing thereof.

Currently, typical semiconductor devices are manufactured using the following steps:

Integrated circuit forming step for forming a number of integrated circuits on a wafer;

Probe test step for implementing a probe test (test on conductivity) on the large number of integrated circuits formed on the wafer;

Dicing step for dicing the wafer into a plurality of chips (cutting individual integrated circuits) after the probe test step;

Packaging step for packaging per chip as a semiconductor device; and

Burn-in test step for implementing a burn-in test (thermal load test) on the semiconductor devices.

Among the above-mentioned steps, the probe test step is a step for testing the conductivity of electrical signals by bringing probes into contact with electrode pads while the plane of a probe unit on which the probes are provided faces the surface of the wafer to be tested. For the probes, tungsten wires whose tip diameter is several $\mu$m, or metallic projections created by means of etching or the like in a polyimide membrane, are used. Each probe normally presses against an electrode pad of the integrated circuits with a load of 1 through 20 gf.

A group of probes provided on a disk-like multi-layered wiring glass epoxy substrate is referred to as a probe card, and a probe card using the metallic projections created by means of etching or the like in a polyimide membrane is called a membrane probe card.

The following are typical examples of known technology related to a membrane probe card:

Nippon Avionics Co., Ltd. (Packard Hughes) Catalog:

According to this known technology (hereinafter referred to as the first known technology), the periphery of the membrane is fixed by a stiffener, a pressure plate is disposed and fixed on the back of part of the membrane where a group of probes (contacts) are created and a spring for applying a suitable load to the wafer is disposed at the center of the upper face of the pressure plate. One center pivot is provided at the center of the pressure plate between the spring and the pressure plate.

Hoya Probe Technology Membrane Probe Card Catalog:

According to this known technology (hereinafter referred to as the second prior art technology), an elastomer is interposed between the membrane and the pressure plate to absorb a dispersion of the height of the probes (bump) more or less.

It is also described in this publication, similarly to the first known technology, that the pressure plate and the membrane are supported by one pivot at the center of the pressure plate so that the pressure plate turns, following the plane to be tested, by pivoting on the center pivot at the moment when the probes come into contact with the wafer even when the pressure plate is not parallel to the plane to be tested.

However, the above-mentioned manufacturing methods have had the following problems from the aspects of reliability and productivity.

[Probe Inspection Step]

The number of integrated circuits which can be tested in batch on one wafer has been limited to one to four so far and so the pressing actions have to be repeated many times in order to test all integrated circuits on the wafer in the above-mentioned first and second technologies. The reason why the number of integrated circuits tested in batch has been limited will be described below.

The electrode pads to be probed are made of a thin Al film 0.8 to 1 $\mu$m thick deposited on Si, and a natural oxide film that is an insulator is formed on the surface thereof as it is left in air. It is essential to control the pressure load (or degree of push) in bringing the individual probe into contact with the electrode pad within an adequate value in order to cause the probes to properly contact all pads in an area to be probed. The adequate value of the pressure load is determined here on the basis of that pressure which causes a probe having a largest load to penetrate through the Al film and reach the Si substrate under the Al film without harming it within the pressure plane, i.e., within the area of the pressure plate, and on the basis of that pressure which causes a probe having the least load to reach the Al film by breaking through the natural oxide film and determine the conductivity. These values of load are influenced by the shape (curvature) of the tip of the probe, the hardness of the Al film and the like.

Primary factors in the dispersion of the pressure load (hereinafter referred to as dispersion) and dispersion absorbing mechanisms of the known technologies will be explained with reference to FIG. 1 and Table 1.

FIG. 1 is a section view of a pressing mechanism and a wafer showing a structural concept of a known typical membrane probe card and the primary factors which contribute to the dispersion of the load, which is problematic when the pressing area is expanded.

A group of probes 1 are formed in the membrane 2, such as a polyimide membrane, in which a single or a plurality of layers of wires are provided and the membrane 2 is bonded to one pressure plate 4 via an elastomer 3. Normally, one pivot member 5 is in point contact with the pressure plate 4 at the center of the upper part of the plate and is connected to a fixed member 7 via a spring 6. The peripheral portion of the membrane 2 is connected electrically and mechanically to a multi-layered wiring glass epoxy substrate. The fixed member 7 is connected mechanically to the substrate.

The primary factors for the dispersion are: 1) an individual difference in the height of the probes, 2) a relative gradient of the pressure plane (the plane where the probes are formed and the surface of wafer), 3) an irregularity (warp) in the wafer (or of the probe forming plane), and 4) a pressure (positioning) error in the height direction. These factors will be explained below in this order.

1) Individual Difference in the Height of the Probes:

The difference in height of each probe caused by error in manufacturing the membrane probe is normally from several to ten-odd $\mu$m.

2) Relative Gradient of the Pressure Plane:

The relative gradient between the pressure plane and the plane to be tested (the surface of wafer) is typically caused by an inclination of the probe card when it is set in the unit, a warping of the glass epoxy substrate itself, an inclination of a wafer chucking plane and the like.

3) Irregularity (Warp) of the Wafer (or of the Probe Forming Plane):

An out-of-plane deformation of the wafer is caused when stress is released in slicing the wafer from a Si ingot or by stress in forming the integrated circuits on the wafer. The allowance thereof is several hundreds $\mu$m in case of a wafer 6 inches in diameter produced in a mass-production process. The allowance is greater for a wafer having a larger diameter.

Meanwhile, the irregularity of the probe forming plane is created mainly in the step of pasting the membrane sheet to the pressure plate.

4) Pressure (Positioning) Error in the Height Direction:

The repeatability of movement in the height direction of the wafer chuck for bringing the probes into contact with the electrode pads is normally around ± several $\mu$m.

The probe test is carried out normally while heating the wafer up to 100 to 150° C. At this time, the probe card is also affected and is heated up. As a result, a phenomenon may occur in that mainly the glass epoxy substrate warps out-of-plane. This is also a large factor in the dispersion of the pressure.

Meanwhile, the known membrane probe card as described above is provided with dispersion absorbing mechanisms corresponding to those respective factors of dispersion. Table 1 shows the correspondence between each factor and the dispersion absorbing mechanism, i.e., the purpose of each dispersion absorbing mechanism.

TABLE 1

Primary Factors of Dispersion and Dispersion Absorbing Mechanisms

| | Primary Factors of Dispersion | Absorbing Mechanism |
|---|---|---|
| 1 | Individual difference of height of probes | Elastomer |
| 2 | Relative gradient between pressure plane (surface of membrane) and surface of wafer | Pivot |
| 3 | Irregularity (warp) of pressure plane and surface of wafer | Elastomer |
| 4 | Error of distance between pressure plane and surface of wafer when in contact (non-stationary out-of-plane thermal deformation of substrate and height positioning error of wafer) | Spring |

The elastomer brings about an effect of regulating a local elastic deformation of large curvature, the pivot produces an effect of a lever and the spring an effect of regulating the height of the whole pressure plate, thereby to absorb the respective factors of dispersion.

It is effective to expand the pressing area of the probe card to increase the number of integrated circuits which can be tested in batch in order to improve the efficiency of the probe test and to improve the productivity of the semiconductor devices.

However, when the pressing area is to be expanded by expanding the size of the pressure plate and the membrane while keeping the known structure, the influence of the primary factors of dispersion 2) and 3) in particular, as seen in Table 1, i.e., the relative gradient of the pressure plane and the irregularity (warp) of the pressuring plane and the plane of the wafer (or the probe forming plane), increases, thus increasing the dispersion of the pressure load. Further, because a required total pressure load increases in proportion to the increase of the testing area, the sliding frictional force of the pivot increases as a result and its ability to follow the relative gradient drops.

Still more, because an excessive load which should be allocated equally to all of the probes is applied transiently and concentratedly to the probe that contacts the wafer earliest, temporally, due to the state of the gradient and the irregularity, the Si substrate of the wafer may be damaged or the longevity (usable number of times for testing) of the probes may drop remarkably due to excessive abrasion.

These phenomena have not only reduced the longevity of the probe card and increased the repair and maintenance costs, but also have damaged the wafer (integrated circuits) which is the object to be probed, thus becoming the largest obstacle to any increase in the number of integrated circuits which can be tested simultaneously in batch. Accordingly, it has been difficult in practice to test a large area simultaneously in batch while keeping the known structure, and it has been impossible to test one large integrated circuit having a size greater than a certain value in one operation.

The burn-in test step also has had a problem in implementing the test of packaged semiconductor devices in that the cost is increased wastefully because chips including an initial failure are also packaged.

SUMMARY OF THE INVENTION

Accordingly, it is an object of the present invention to provide semiconductor devices and a method of manufacture thereof, which enhance the reliability and productivity of the integrated circuits by suppressing dispersion of the load within an allowable range even if probes in a larger area are pressed in batch and by implementing a probe test/burn-in test on a large number of integrated circuits or an integrated circuit having a large dimension in one operation.

It is another object of the present invention to provide semiconductor devices and a method of manufacture thereof which enhance the productivity by omitting the burn-in test step without packaging chips which include an initial failure.

The above-mentioned problems may be solved as follows.

(1) A semiconductor device manufacturing method is employed which comprises a integrated circuit forming step for forming a number of integrated circuits on a wafer; a probe test step for implementing a probe test (test on conductivity) on the wafer on which a large number of integrated circuits have been formed; a burn-in test step for implementing a burn-in test (thermal load test) on the wafer on which a large number of integrated circuits have been formed; and a dicing step for dicing the wafer into a plurality of chips after completion of the probe test step and the burn-in test step.

Because this manufacturing method allows the burn-in test to be carried out in the wafer state, the heating furnace may be scaled down and the quantity of heat may be reduced as compared to the known burn-in test in the state of final products in the manufacture of resin encapsulated type semiconductor devices. Thereby, the productivity of the semiconductor devices may be improved.

Further, because this manufacturing method allows chips including an initial failure to be eliminated, it is possible to prevent useless cost by not packaging chips including an initial failure.

(2) In the semiconductor device manufacturing method of paragraph (1), integrated circuit protecting members/external connecting terminals are attached to an integrated circuit forming plane of the wafer after completion of the probe test step and the burn-in test step, and the dicing step is carried out thereafter.

This manufacturing method allows the productivity of semiconductor devices to be improved because the external connection terminals are attached in the wafer state and the semiconductor devices are consummated at the point of time when the dicing step ends.

(3) In a semiconductor device manufacturing method comprising an integrated circuit forming step for forming a number of integrated circuits on a wafer; a probe test step is carried out for implementing a probe test (test on conductivity) on the wafer on which a large number of integrated circuits have been formed; and a burn-in test step is carried out for implementing a burn-in test (thermal load test) on the wafer on which a large number of integrated circuits have been formed; the probe test step/burn-in test step comprising a pressing step for pressing a plurality of probes provided in a membrane to the wafer by using pressure members, and the pressure load is applied to a plurality of locations of a plane of the pressure member on the side opposite the wafer in pressing the plurality of probes.

(4) In the semiconductor device manufacturing method of paragraphs (1) or (2), the probe test step/burn-in test step further comprises a pressing step for pressing a plurality of probes provided in a membrane against the wafer by using pressure members and a pressure load is applied to a plurality of locations of planes of the pressure members on the side opposite from the wafer in pressing the plurality of probes.

These manufacturing methods allow the reliability and productivity of the semiconductor devices to be enhanced because the dispersion of the load in pressing the pressure members against the wafer may be controlled within an allowance, even if an irregularity exists on the wafer, and so a large number of integrated circuits may be tested reliably in one testing operation.

It is noted that the pressure member mentioned here is a member for pressing the plurality of probes provided on the membrane against the wafer and does not include a material (elastomer and the like) for attaching the pressure member to the membrane.

(5) In the semiconductor device manufacturing method of paragraphs (3) or (4), a plurality of pressure members may be provided.

(6) In the semiconductor device manufacturing method of paragraphs (3) or (4), a plurality of pressure members may be provided, and the pressure load is applied to planes of the plurality of pressure members on the side opposite the wafer in pressing the plurality of probes.

These manufacturing methods allow the reliability and productivity of the semiconductor devices to be enhanced because there are a plurality of pressure members and the irregularity absorbing capability is enhanced. Further, it is possible to avoid problems of the wafer being damaged and the longevity of the probe being reduced due to transient concentration of the load because, even if a dead load (pressure load) of a weight works on part of the probes temporarily, the total load applied by one weight is within a range of the dead load (pressure load) of that weight.

(7) In the semiconductor device manufacturing method of paragraphs (3) or (4), one weight is used to apply the pressure load and the planes of the pressure members on the side opposite from the wafer are connected with the weight by a plurality of elastic bodies.

(8) In the semiconductor device manufacturing method paragraphs (3) or (4), there are a plurality of pressure members, one weight is used to apply the pressure load, and the planes of the pressure members on the side opposite from the wafer are connected with the weight by a plurality of elastic bodies.

These manufacturing methods allow the structure to be simplified because there is only one weight. Further, because it is not necessary to set the size of the weight in the wafer plane direction in correspondence to the size of the pressure plate, it is possible to provide a larger (heavier) weight. Still more, because it is possible to more flexibly accommodate an irregularity on the surface of the wafer, the system works more effectively even for an irregularity on the surface of the wafer which cannot be absorbed by the elastic body by using a more flexible material for the weight.

(9) Semiconductor devices may be manufactured by any one of the manufacturing methods of paragraphs (1) through (8). The highly reliable semiconductor devices whose productivity is enhanced may be provided by the inventive manufacturing methods described above.

The specific nature of the invention, as well as other objects, uses and advantages thereof, will clearly appear from the following description and from the accompanying drawings in which like numerals refer to like parts.

DESCRIPTION OF PREFERRED EMBODIMENTS

Figure 1:
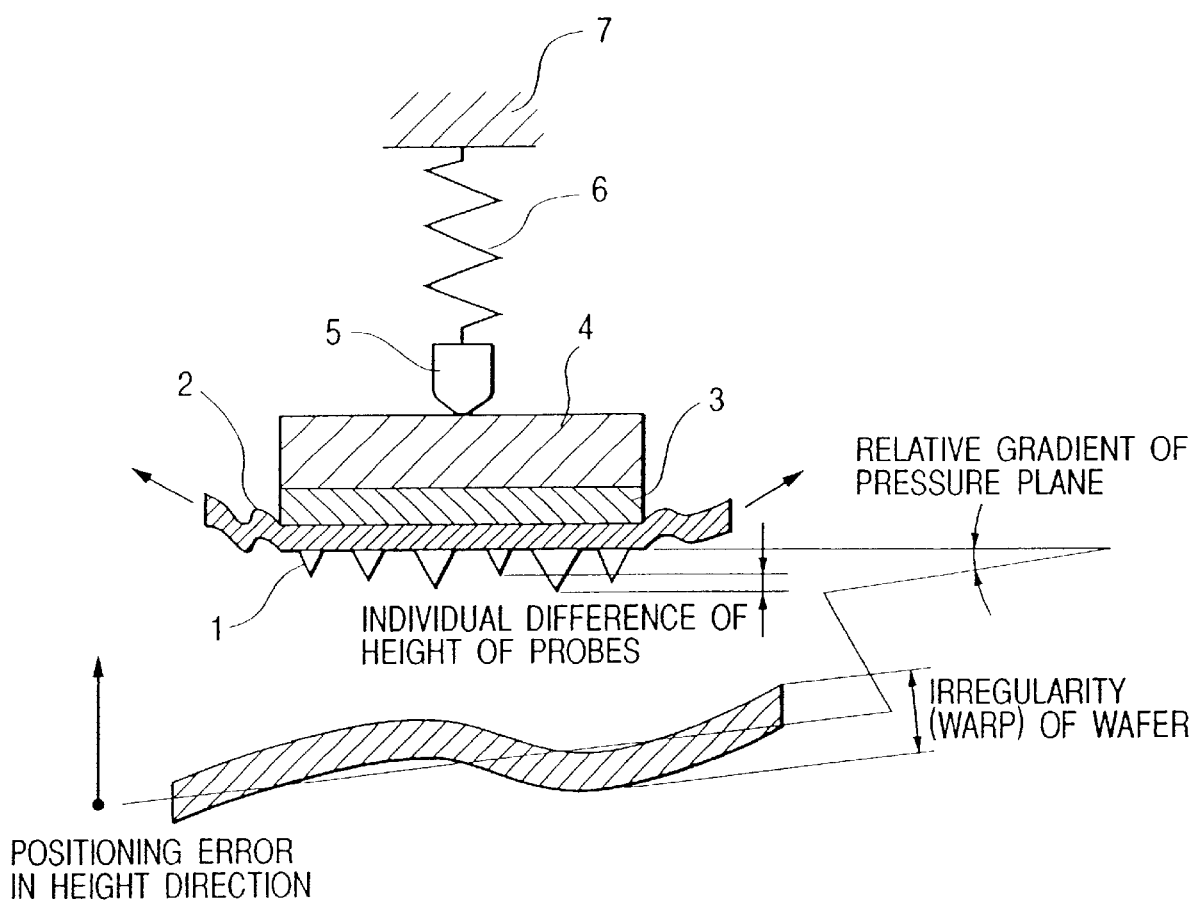
FIG. 1 is a side sectional view showing the structural arrangement of a known probe card and the primary factors in the dispersion of a pressure load.

Preferred embodiments of the present invention will be explained below with reference to the drawings.

Semiconductor devices are manufactured through the following steps in the present embodiment:

Integrated circuit forming step for forming a large number of integrated circuits on a wafer;

Probe test step for probing (test on conductivity) the wafer on which the large number of integrated circuits have been formed;

Burn-in test step for implementing a burning-in test (thermal load test) on the wafer on which the large number of integrated circuits have been formed; and Dicing step for dicing the wafer into a plurality of chips (cutting individual integrated circuits) after completion of the probe test step and the burn-in test step. Each of the steps will be explained below in detail.

[Integrated circuit Forming Step]

Integrated circuits are formed while undergoing many unit steps per specification of the integrated circuits to be manufactured on a wafer which has been obtained by thinly slicing an ingot of mono-crystal Si and by mirrorpolishing the surface thereof. In case of a typical CMOS (Complementary Metal Oxide Semiconductor) device, for example, it is formed roughly through a step of forming P-type and N-type regions on the wafer substrate, an integrated circuit separating step, a gate forming step, a source/drain forming step, a wiring step, a protection film forming step and the like. These steps will be explained below briefly.

In the step of forming the P-type and N-type regions, ions of B and P are implanted in the surface of the wafer and the regions thereof are extended on the surface by diffusion. In the integrated circuit separating step, a Si oxide film is formed on the surface described above, a nitride film is patterned to select regions and the oxide film at the part where the nitride film is not patterned is grown selectively to form individual micro-devices.

In the gate forming step, an electrode is formed by forming a gate oxide film several nm thick between the above-mentioned respective integrated circuits and by cutting to a predetermined size after depositing poly-Si by means of CVD (Chemical Vapor Deposition).

In the source/drain forming step, a source/drain diffusion layer is formed by implanting ions of impurities of P and B after forming the gate electrode and by activating by annealing.

In the wiring step, the respective integrated circuits separated as described above are connected electrically by stacking an Al wire, an interlayer insulating film and the like.

In the protection film forming step, a protection film is formed on the surface of the circuit to block impurities and moisture from entering the micro-devices created as described above from the outside and to protect the LSI from mechanical stress in packaging the circuit later.

One sheet of wafer has a thickness of several hundreds $\mu$m and a diameter of 4 inches to 8 inches, and 200 to 400 circuits are created on the surface thereof in the case of a DRAM (Dynamic Random Access Memory) through the above-mentioned steps. One edge of one circuit is several to ten-odd mm and several tens to several hundreds of electrode pads are provided within one circuit. The surface of each electrode pad is a quadrilateral whose one edge is several tens $\mu$m.

[Probe Inspection Step]

The conductivity of electrical signals of each integrated circuit formed in the integrated circuit forming step is tested in this step. Normally, it is carried out by using a probe unit so as to bring each probe into contact with an electrode pad within the circuit in a one to one relationship.

Figure 2:
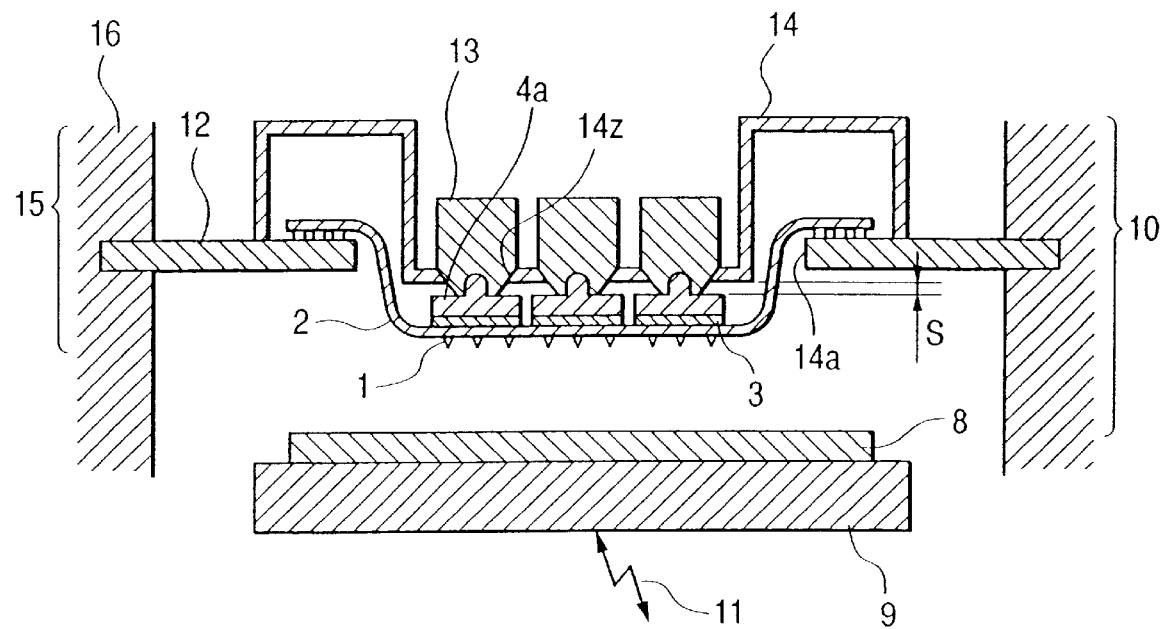
FIG. 2 is a side sectional view of a probe unit used in manufacturing semiconductor devices according to one embodiment of the present invention.
Figure 3:
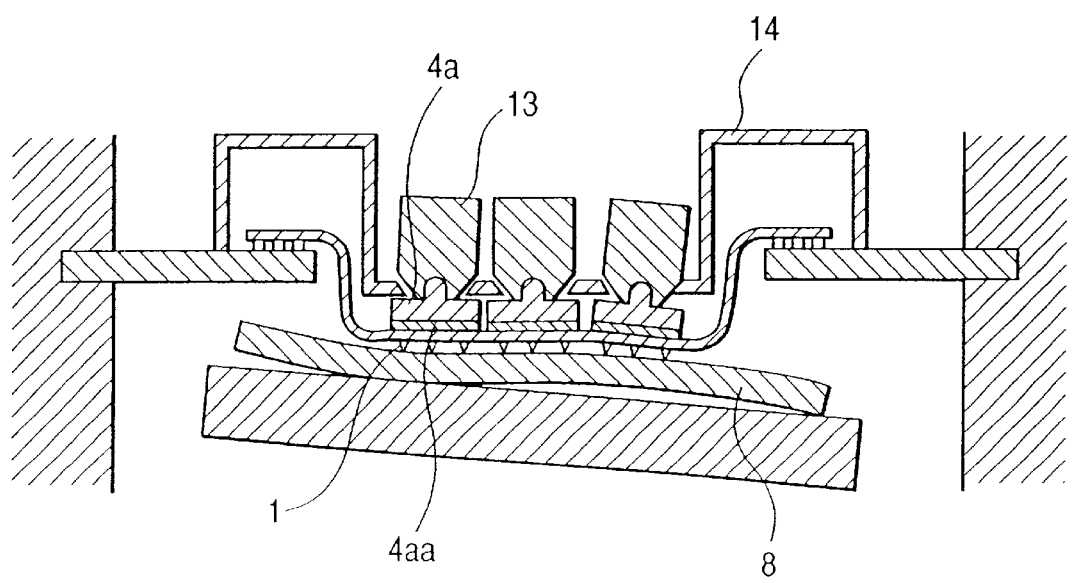
FIG. 3 is a side sectional view showing a state where the probe unit in FIG. 2 is pressing against a wafer having an arbitrary gradient and irregularity)

FIGS. 2 and 3 show sectional structural views of the probe unit used in the present embodiment and a testing method of using it. A smaller number of probes and of upper pressure mechanisms than the actual number thereof are shown in order to simplify the drawings.

As shown in FIG. 2, the probe unit used in the present embodiment comprises a wafer chuck 9 for mounting a wafer 8, i.e., the object to be tested, and a probe system 10. In outline, the probe system 10 is constructed by fixing a probe card 15 to a signal transmitting section 16. The probe card 15 comprises a membrane 2 provided with a plurality of probes 1 which are to contact the electrode pads (not shown) of the wafer 8, a plurality of pressure plates 4a, located above the membrane 2, for pressing the probes 1, an elastomer 3 interposed between each membrane 2 and a corresponding pressure plate 4a, a disk-like glass epoxy substrate (hereinafter referred simply as a substrate) 12 which has multi-layered wires (not shown) and is electrically connected with the peripheral portion of the membrane 2, weights 13, located above the respective pressure plates 4a, for applying a load for pressing the probe toward the wafer by its own weight, and a main body 14 in which tapered counter bores 14z are created in order to define static positions where the weights 13 are stabilized.

Meanwhile, the wafer chuck 9 comprises a vacuum adsorbing mechanism (not shown) for temporarily fixing the wafer 8 and a height-direction moving mechanism 11 for facilitating contact between the wafer 8 and the probes. The height-direction moving mechanism 11 causes the wafer chuck 9 to approach the probe system 10 to effect contact between the group of probes 1 and the electrode pads of the wafer 8 to the test electrical characteristics of the semiconductor devices.

The membrane 2 is made of a polyimide film, for example, and the group of probes 1 are formed thereon by a known method, e.g., etching. Printed wires (not shown) for transmitting electrical signals are provided between the group of probes 1 and the substrate 12. There is a case in which a plurality of layers of printed wires may be provided according to the number and density of the wires.

The respective pressure plates 4a are disposed one- or two-dimensionally in the in-plane direction of the wafer 8, while leaving intervals of about several hundreds μm, and are bonded to the membrane 2 via the elastomer members 3. The portion above each pressure plate 4a is connected with a lower part of the weight 13, which is cut in accordance with the shape of the counter bore 14z and is inserted therein from the upper part of the main body 14. The size and plan shape of each pressure plate 4a is determined so that dispersion of the pressure load of each probe 1 pressed by it is kept within a predetermined allowance. That is, they are set so that the individual difference in height of the probes and the irregularity (warp) of the pressure plane and the surface of the wafer, among the primary factors of the dispersion of the pressure load described in Table 1, fall within a range of predetermined values or less.

The main body 14 has enough rigidity and hardness, so that it will not deform even if a plurality of weights 13 are provided and a significant weight is brought to bear on it. The main body 14 is provided also with the tapered counter bores 14z, and one weight 13 is inserted in each counter bore 14z so that each weight 13 will be restored and stabilized accurately to its initial position even if the weight 13 is repeatedly displaced by the pressure.

The dead weight which each weight 13 should have is affected largely by the shape (curvature) of the tip of each probe 1, and its adequate value is determined so as to provide a required pressure load per probe, based on the number of probes within the pressure plate 4a connected to that weight 13 and the pressing area. Each weight 13 is made of a material having a large specific weight of around 7 or more in order to satisfy the required load while minimizing the volume thereof. The maximum value of the stroke in the height direction of each weight 13 when it is pushed up by the wafer is determined by the spacing S.

The substrate 12 is a multi-layered structural body whose base materials are glass and epoxy, and it is provided, at the center thereof, with a through hole 14a having a specification defined by the shape and dimension of the main body 14 and the membrane 2. The main body 14 is connected mechanically to the upper face of the substrate 12. As a result, the substrate 12 can prevent the pressing mechanisms within the main body 14 from falling.

A mode of operation of the pressing mechanism when a wafer having an arbitrary inclination and warp is probed by this probe unit will be explained with reference to FIG. 3.

FIG. 3 is a side section view showing a state where the surface of the wafer 8 having an arbitrary inclination and warp contacts the group of probes 1, and a pressure load is applied to each probe.

In FIG. 3, each weight 13 is being pushed up by the wafer 8 and is being moved upward relative to the main body 14. Each pressure plate 4a is stabilized while keeping the orientation of a pressure plane 4aa parallel with the orientation of the wafer 8 right under it.

In this state, all of the probes are controlled always within the allowance of the dispersion of the load, because all of the dispersion factors of the load shown in Table 1 are reduced or eliminated for the following reasons:

(1) Individual Difference in Height of the Probes and (3) Irregularity (Warp) of the Wafer:

The dispersion of the load for all of the probes 1 within an area of one pressure plate 13 set as described above is kept always within the above-mentioned allowance.

(2) Relative Gradient of the Pressing Plane:

Because each pressure plane 4aa becomes parallel with the relative gradient of the respective confronting area of the wafer 8, it will cause no dispersion.

(4) Positioning Error in the Height Direction:

Because the stroke of the pressure plate 4a and the weight 13 in the height direction in contacting the wafer 8 has nothing to do with the pressure load, it will cause no dispersion.

Further, the pressure load per each pressure plate 4a is kept equal by controlling the weight of the weight 13 connected to each pressure plate 4a.

The probe unit of the present embodiment also makes it possible to avoid the problems that the wafer is damaged or the longevity of the probe is reduced due to the transient concentration of the load described in the known probe units. This is because, even if the dead weight of the weight works only on part of the probes temporarily, the total load applied by one weight is within the dead weight of the weight and the dead weight is reduced by providing a plurality of weights.

Next, the plan shape of the membrane of the probe unit and the disposition of each pressure plate of the present embodiment will be explained with reference to FIGS. 4 and 5.

Figure 4:
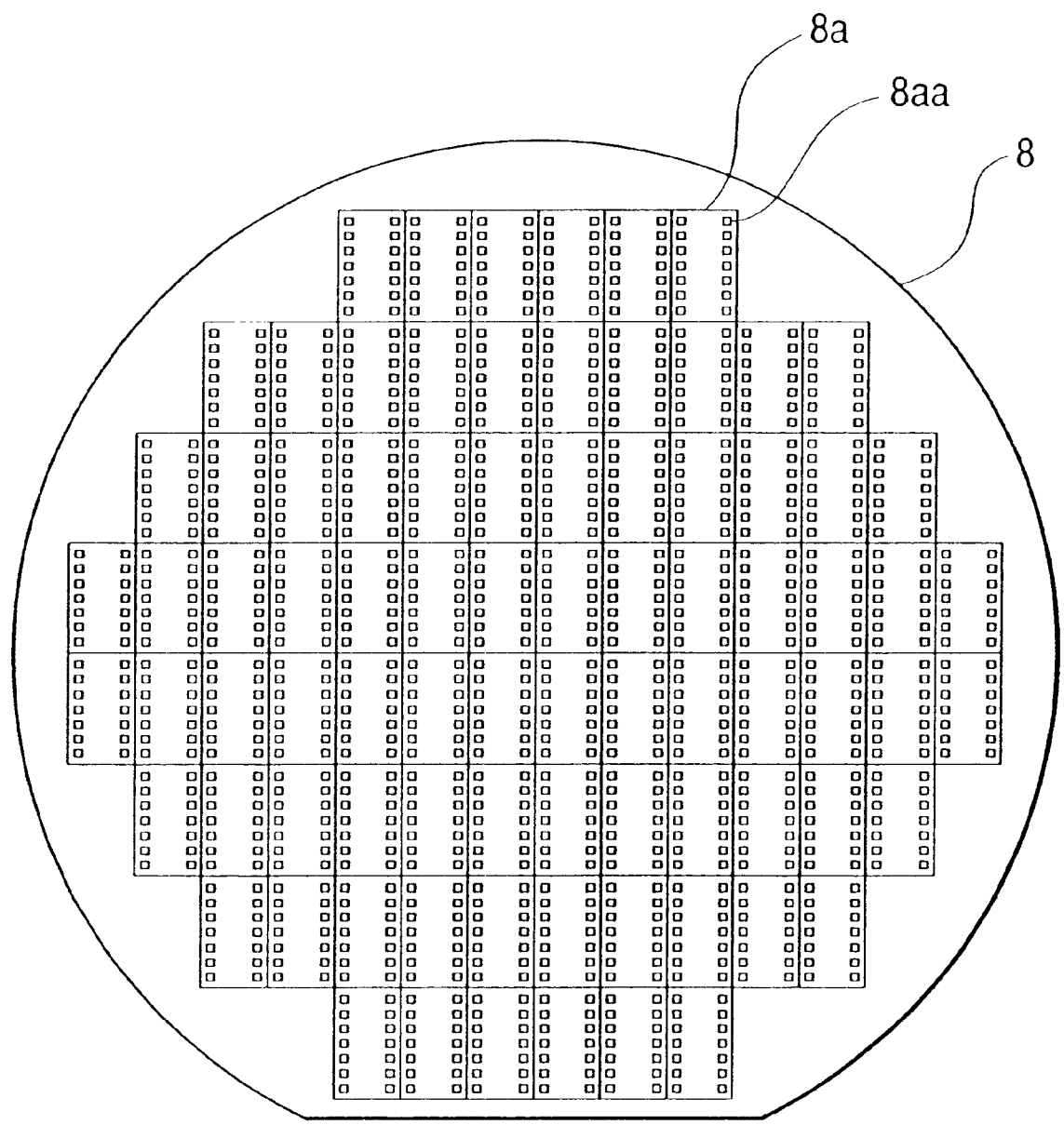
FIG. 4 is a top plan view of a wafer showing one example of the disposition of integrated circuits within a wafer and the electrode pads within the integrated circuits)

FIG. 4 is a top plan view of a wafer showing one example of the disposition of integrated circuits within the wafer and of the electrode pads within the integrated circuits as provided in a mass-production system.

In FIG. 4, the wafer 8 is circular and has a diameter of 6 inches, 8 inches or the like. Each rectangular section disposed in plan therein is a integrated circuit 8a whose one edge is several to ten-odd mm. A group of electrode pads 8aa are disposed on the surface of each integrated circuit 8a. The pitch of each electrode pad 8aa is in the order of about 100 μm (they are magnified here with respect to the integrated circuit 8a in order to clearly show the mechanism).

Figure 5:
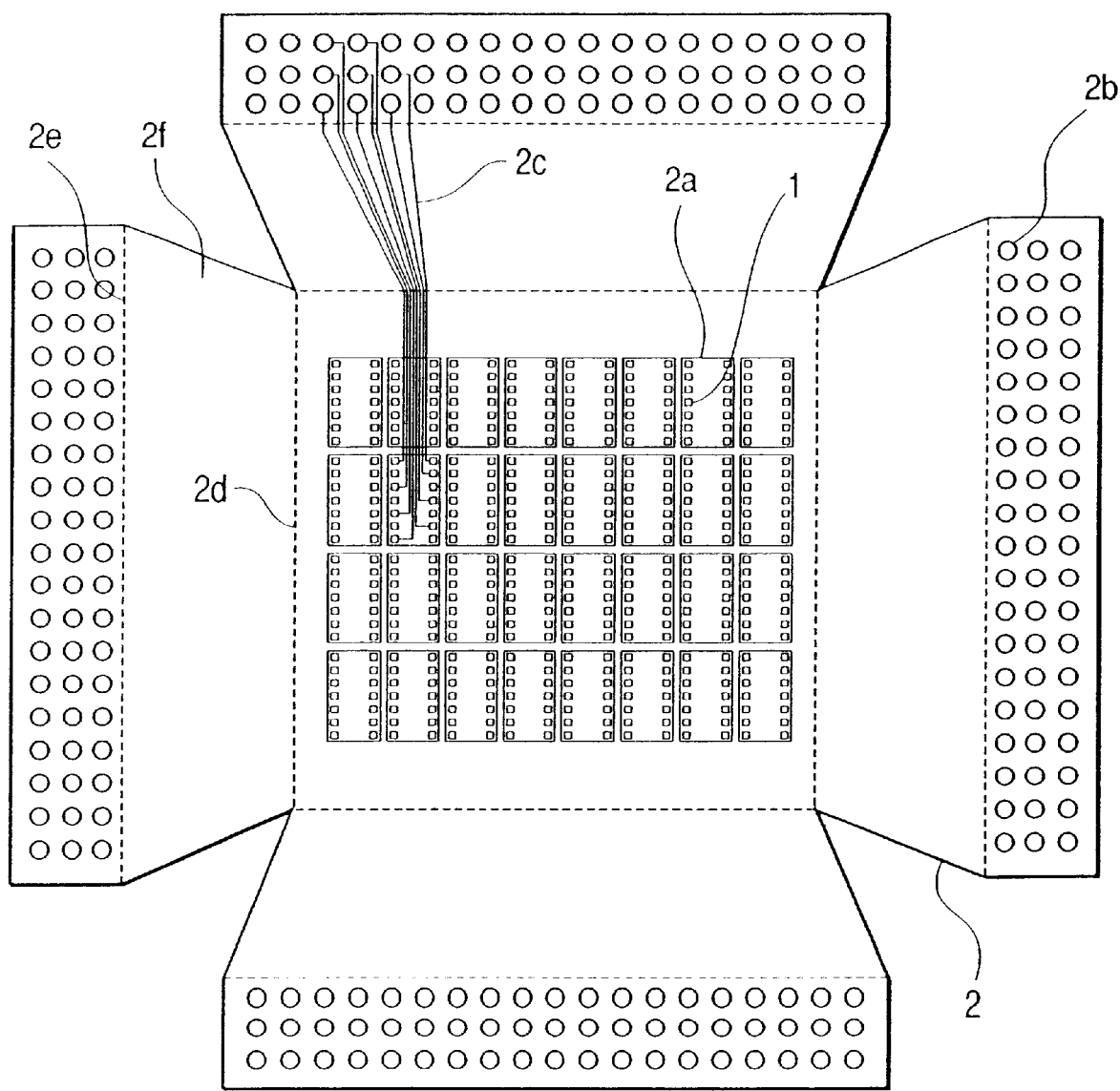
FIG. 5 is a top plan view showing one example of a membrane for a probe unit for pressing against the wafer in FIG. 4 according to one embodiment of the present invention.

FIG. 5 is a top plan view showing one example of a membrane for the probe unit for pressing against the wafer in FIG. 4. Each probe 1 is provided at a position coincident with the disposition of the individual electrode pad. A rectangular area 2a surrounded by a halftone screen corresponds to the shape of the pressure plane of one pressure plate. Accordingly, a pressing area 2a per one pressure plate corresponds to the size of one integrated circuit in this example, and the electrode pads of 32 integrated circuits may be tested at the same time. Although the shape and dimension of the pressure plate, which permits the dispersion of the pressure load to be kept within a predetermined allowance, originally has nothing to do with the shape of the integrated circuit, it is effective as the shape of the pressure plane because sufficient performance may be often obtained when its area is about the size of one integrated circuit, for example, like the present embodiment, and because it is convenient to effect repeated pressing by moving the position of the probes.

It is preferable to maintain a certain degree of flatness of the membrane 2 within an area surrounded by a broken line 2d, and there is a case when another embodiment, as described later, is adopted for that end. An area 2f surrounded by the broken line 2d and a broken line 2e is provided so as to have a sag from the beginning, as is apparent from FIGS. 2 and 3.

The membrane 2 extends in four directions from the center (the area surrounded by the broken line 2d), and groups of electrodes 2b are provided in the four peripheral portions to connect electrically with the substrate. Each probe 1 is connected individually and electrically with an electrode 2b via a printed wire 2c. Thereby, electrical signals are given/taken between the electrode pads and the outside. Here, the area of the membrane which extends from the center in the four directions may be determined by the number of printed wires 3, which depends on a number of probes 1, and by the density of the wires. Accordingly, when the density of wires is high, for example, the membrane may be extended in eight directions. Or, conversely, it may be extended also in two or one direction Further, when an area of the center part of the membrane 2 is large and the membrane cannot be extended to the periphery due to a limit in the manufacturing process of the membrane 2, indirect electricity conducting means may be provided further between the membrane 2 and the substrate.

Although an arrangement of the probes and membrane which can test 32 integrated circuits at the same time has been shown as one example here, it is also possible to test many more integrated circuits, e.g., all integrated circuits within the wafer, at the same time by increasing the number of probe forming areas and the number of pressure plates because the present invention causes no particular problem even if the number of simultaneous testing areas is increased with respect to the abovementioned arrangements.

Further, although an example in which the shape of the pressure plane of each pressure plate is a simple rectangle has been shown here, it is also possible to create recesses for adhesive and the membrane 2 by providing counter bores within the pressure plane so that part of the membrane 2 where no probe exists causes no uplift and no improper out-of-plane deformation in bonding the pressure plate with the membrane 2, for example.

The probe test may be applied to cases other than that described above within a suitable range according to the present invention. Those cases will be explained below.

Figure 6:
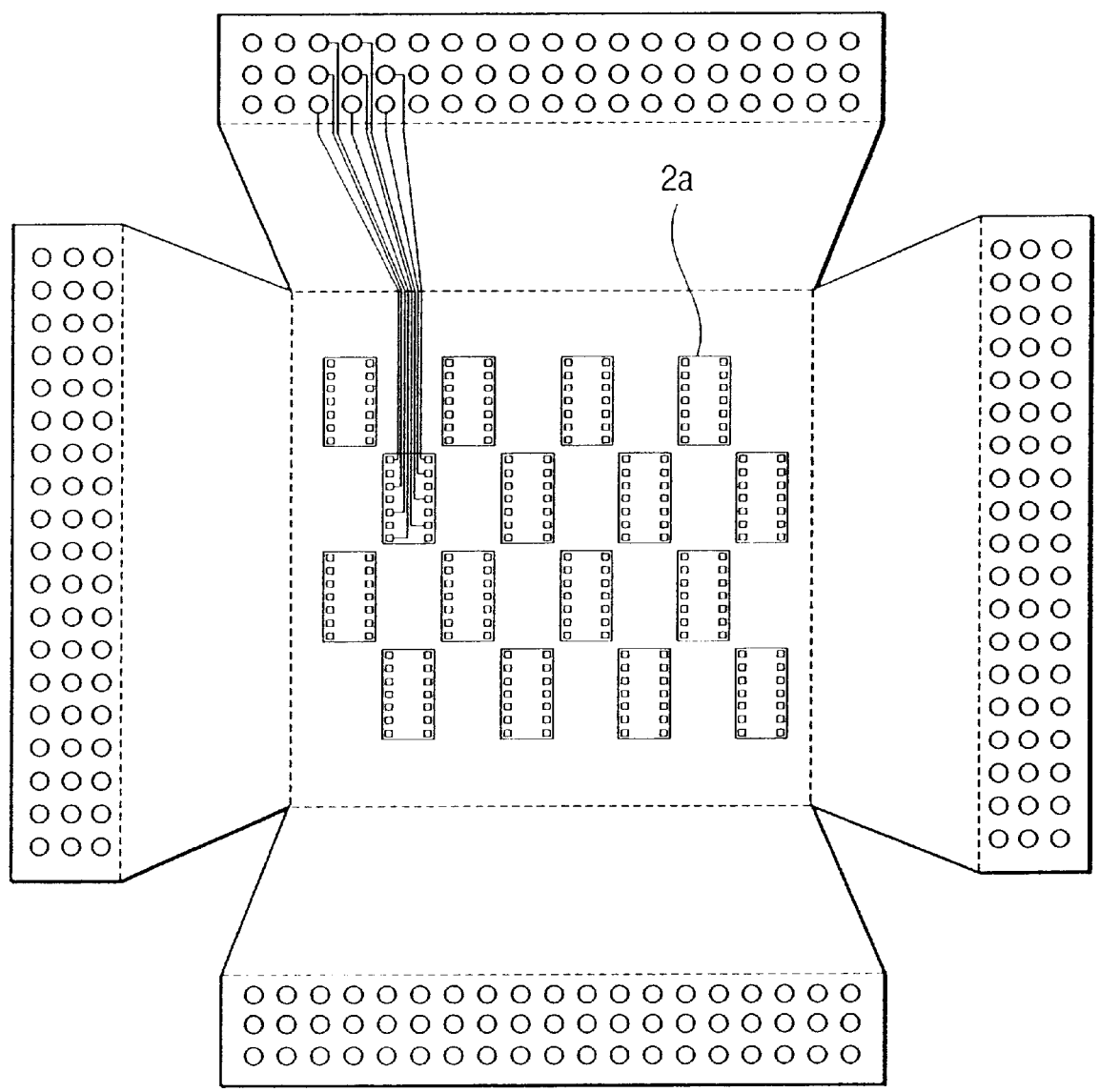
FIG. 6 is a top plan view showing one example of a membrane for a probe unit for pressing against the wafer in FIG. 4 according to one embodiment of the present invention.

A. Cases When the Shape and Disposition of the Pressure Plates Are Changed:

A1. Case When the Distance Between Neighboring Pressure Plates is Widened:

As shown in FIG. 6 in which the shape of the pressure plate 2a is shown by a halftone screen, the distance of one integrated circuit is provided between the pressure plates in FIG. 5 for example. When electrode pads are disposed along the outline of the integrated circuit as shown in FIG. 4, the distance between the electrode pads of the adjacent integrated circuits becomes small, so that a problem may occur in that the pressure plates interfere with each other depending on the irregularity of the wafer, or in that the elastomer or the membrane deform peculiarly at the peripheral portion (edge portion) of the pressure plates. In such a case, it becomes necessary to avoid such trouble by sacrificing a number of integrated circuits to be tested at the same time, like the present case.

Figure 7:
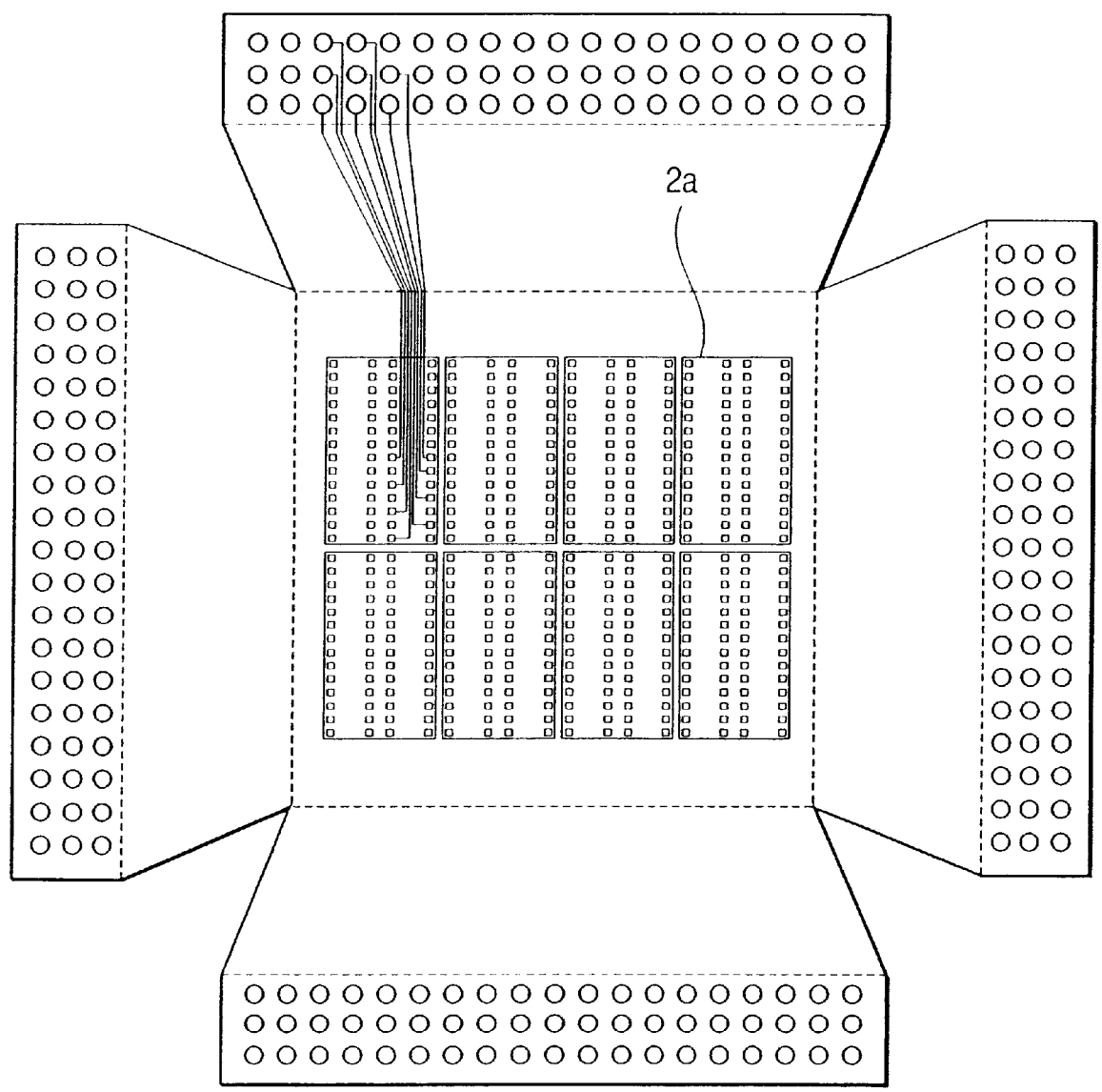
FIG. 7 is a top plan view showing one example of a membrane for a probe unit for pressing against the wafer in FIG. 4 according to one embodiment of the present invention.

A2. Case When a Plurality of Integrated Circuits are Covered by One Pressure Plate:

As shown in FIG. 7 in which the shape of the pressure plate 2a is shown by a halftone screen, the shape of the one pressure plate in FIG. 5 is expanded so as to be able to cover four integrated circuits for example. Because the shape of the pressure plate allowable in accordance with the present invention has nothing to do with the size and shape of the individual integrated circuit, as described above, it is preferable to simplify the structure by reducing the number of individual pressure plates by increasing the size thereof, as described above, when the irregularity of the wafer, the dispersion in the height of the individual probes and the size of the individual integrated circuits are small.

Figure 8:
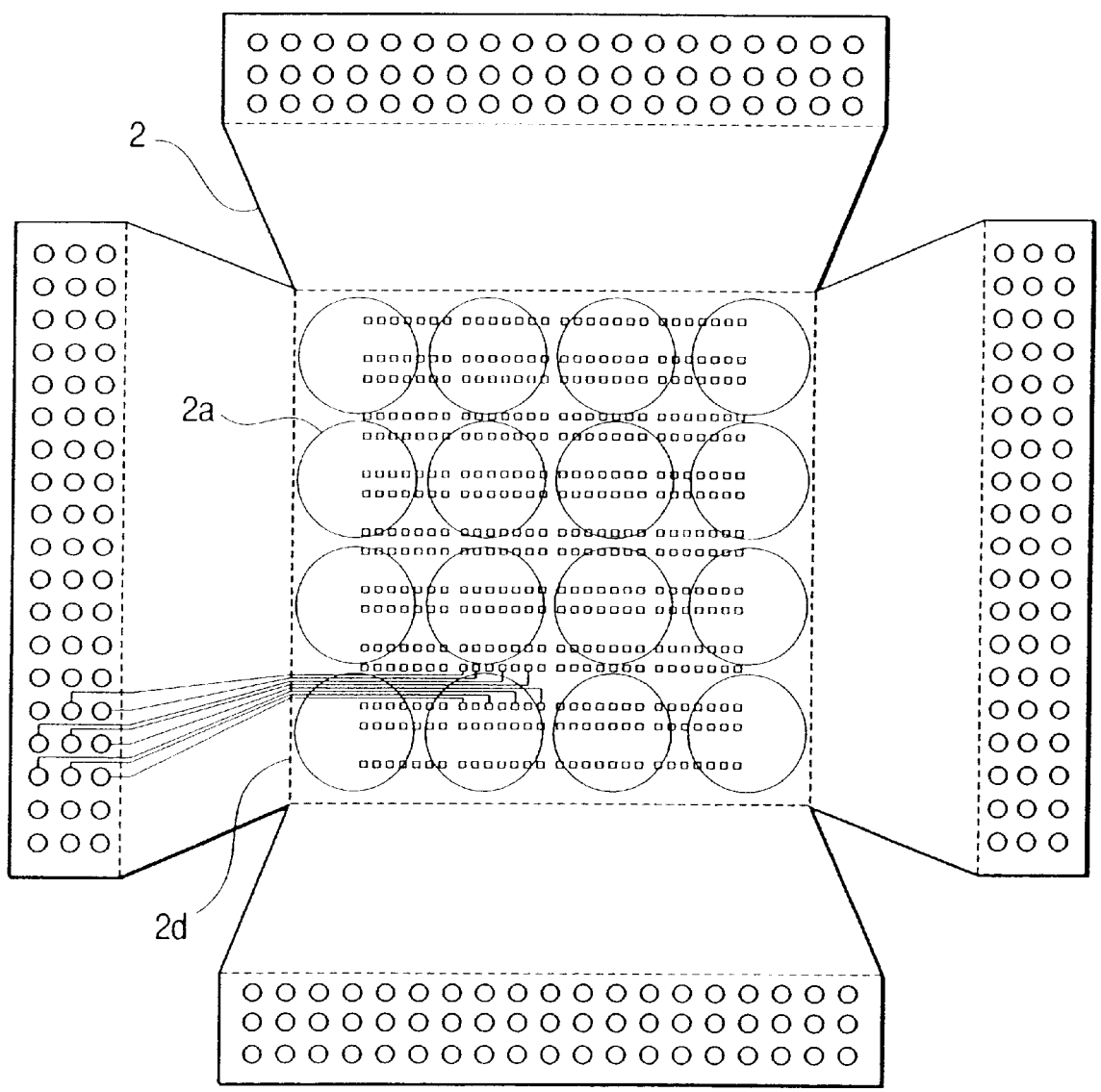
FIG. 8 is a top plan view showing one example of a membrane for a probe unit for pressing against the wafer in FIG. 4 according to one embodiment of the present invention.

A3. Case When the Shape and Disposition of the Pressure Planes do not Depend on the Shape and Disposition of the Integrated Circuits:

As shown in FIG. 8 in which the shape of the pressure plate 2a is shown by a halftone screen, the pressure plane of one pressure plate in FIG. 5 is made into a circular shape, for example, and a plurality of pressure plates are disposed so as to uniformly press against the center area (within the broken line 2d) which must be flat in macro. The present example is applied to a case when the membrane 2 has a proper rigidity and allows the load to be continuously applied even in the area where it is not pressed directly due to the pressure plates pressing against the periphery thereof. The present case is suitable in reducing the number of pressure plates to simplify the structure.

Figure 9:
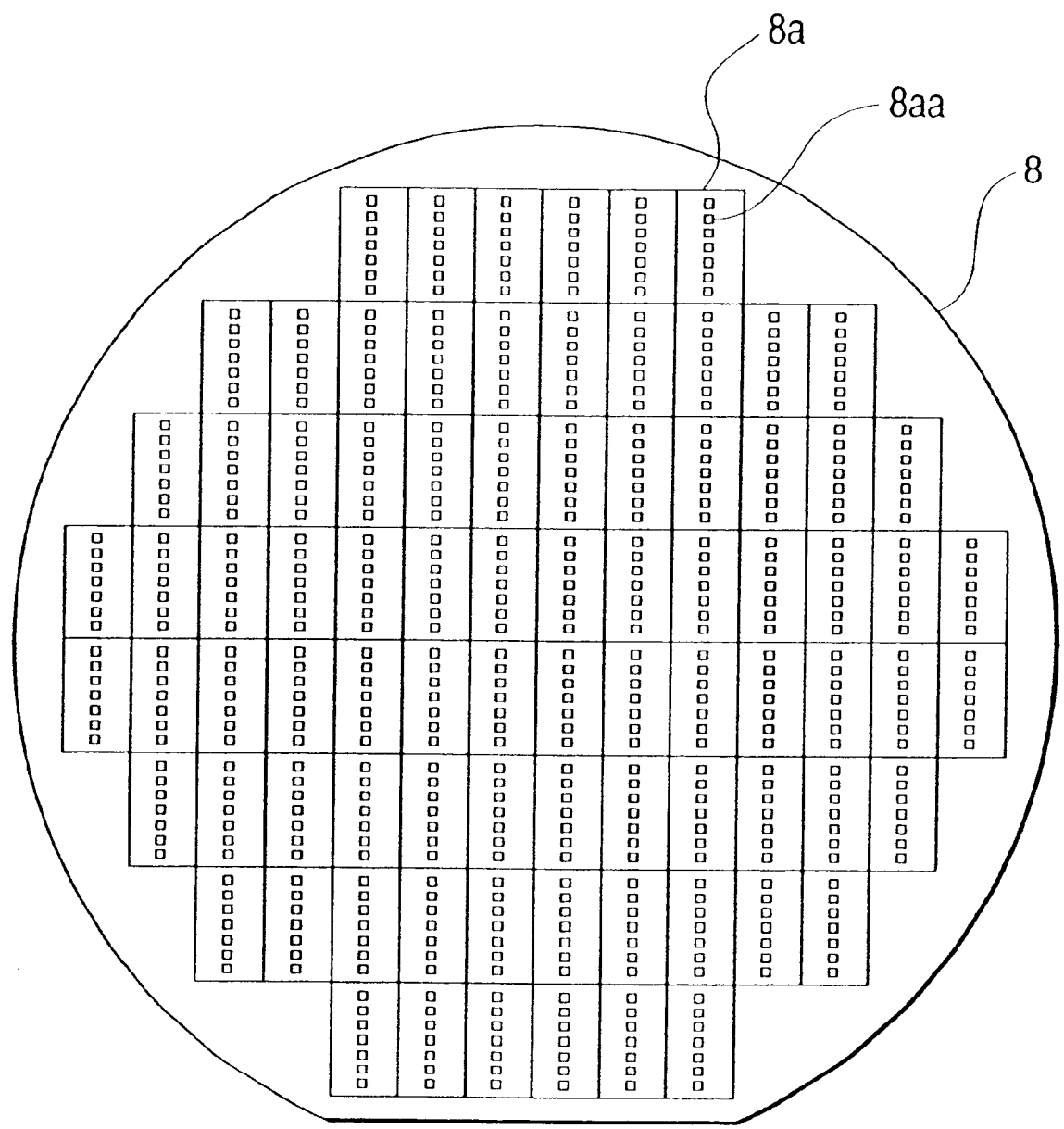
FIG. 9 is a top plan view of a wafer showing one example of the disposition of integrated circuits within the wafer and the electrode pads within the integrated circuits.
Figure 10:
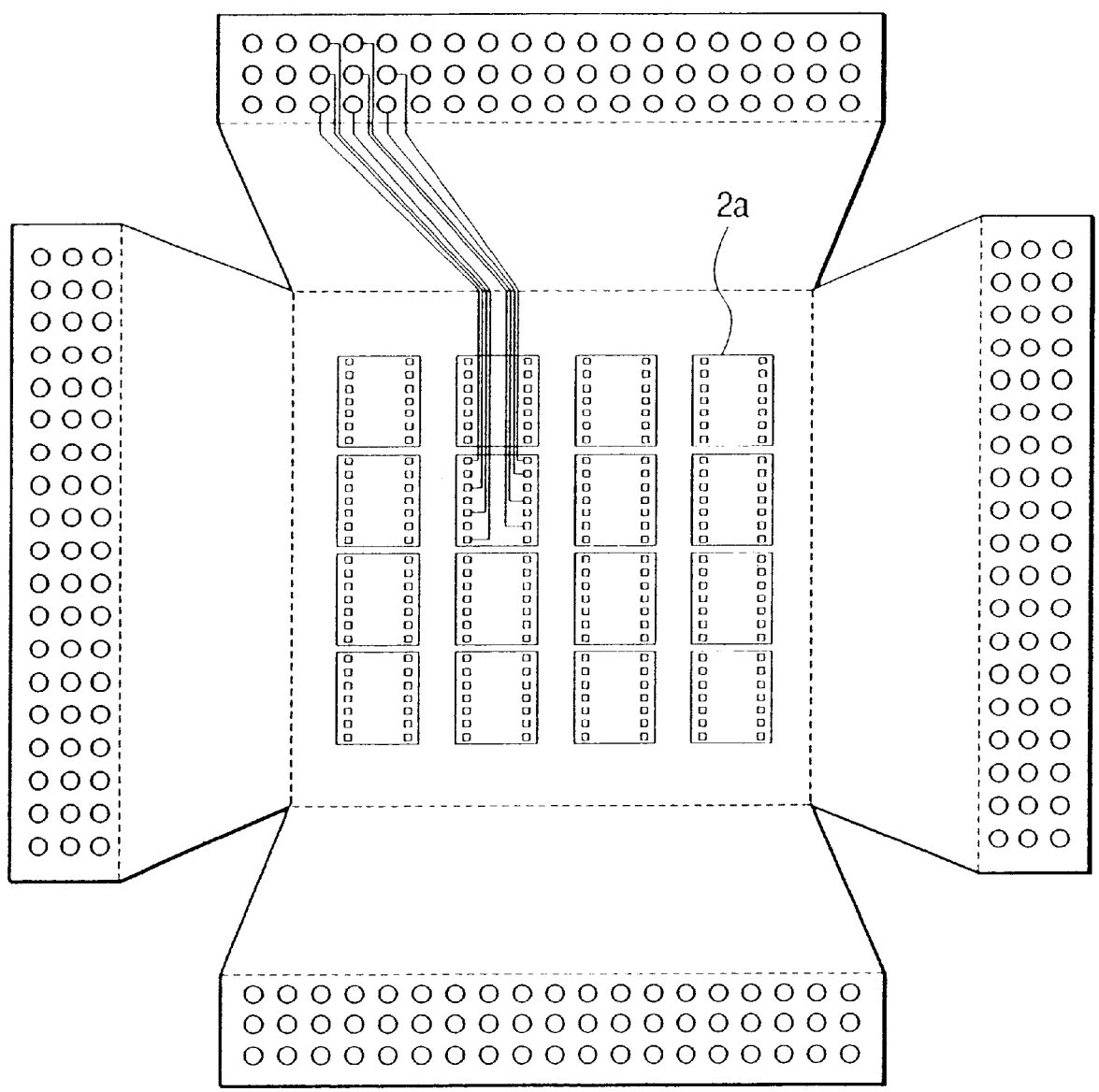
FIG. 10 is a top plan view showing one example of a membrane for a probe unit for pressing against the wafer in FIG. 9 according to one embodiment of the present invention.

A4. Case Accommodating the Testing of Integrated Circuits Having Electrode Pads Specially Disposed:

The pressing areas 2a are disposed as shown in FIG. 10 so as to include groups of electrode pads of two integrated circuits to accommodate the case where the integrated circuits 8a, in which the group of electrode pads Baa are arrayed in a row at the center, are formed within the wafer 8 as shown in FIG. 9. A sufficient interval between the pressure plates may be obtained by not pressing the area where no electrode pads 8aa exist in testing the integrated circuits 8a, shown in FIG. 9, at the same time, so that the pressure plates may be disposed continuously and the continuously neighboring integrated circuits 8a may be tested in batch at the same time.

Figure 11:
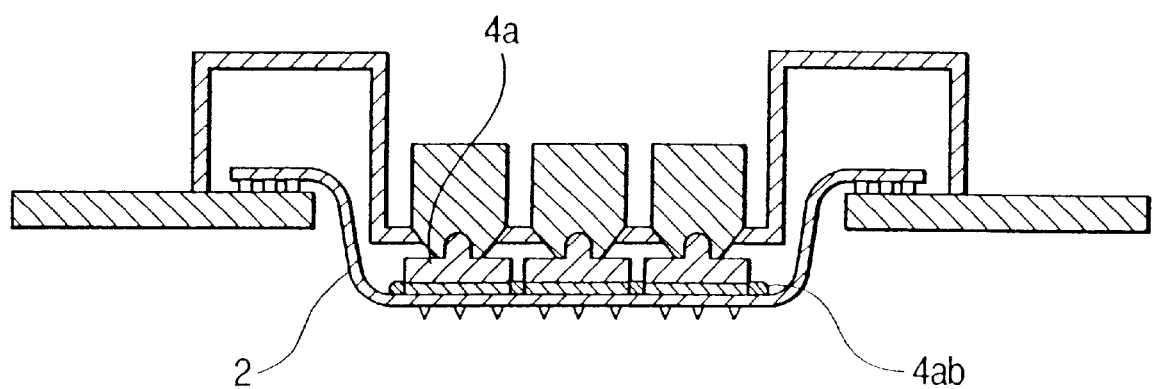
FIG. 11 is a side sectional view showing one example of the probe unit being used in semiconductor device manufacturing steps according to one embodiment of the present invention.

A5. Case of Bonding the Side of Each Pressure Plate by Resin:

The side faces of the respective pressure plates 4a are bonded by a thermo-setting resin 4ab, for example, as shown in FIG. 11. Thereby, the rigidity of part of the membrane where the pressure plates do not exist may be enhanced, so that concentration of the strain on the membrane 2 between the pressure plates 4a may be reduced and plastic deformation of the membrane 2 and dislocation caused thereby may be prevented from occurring even when the displacement in the height direction and the orientation of each pressure plate 4a change independently as they come into contact with a wafer having a warp. The present case may be also used as complementary means for carrying out the applied case A3, i.e., as means for increasing the rigidity of part of the membrane 2 where the pressure plates 4a do not exist.

Figure 12:
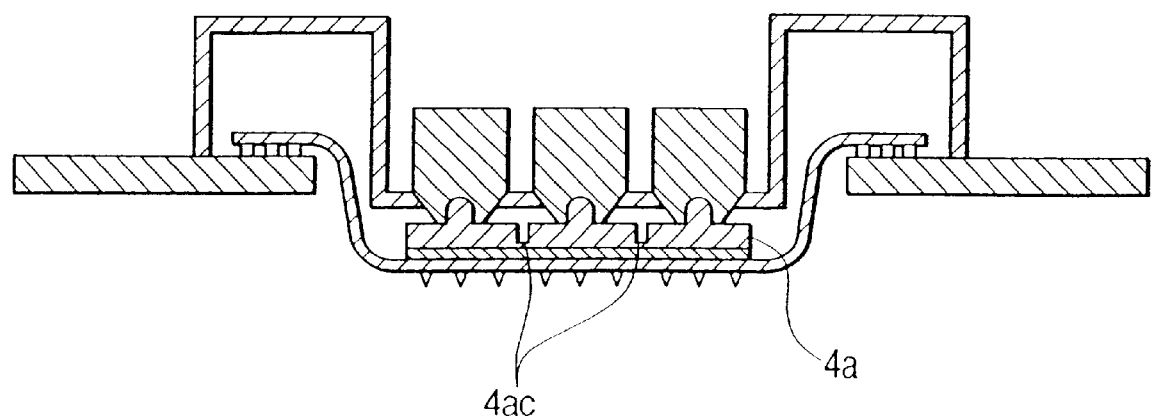
FIG. 12 is a side sectional view showing one example of the probe unit being used in semiconductor device manufacturing steps according to one embodiment of the present invention.

A6. Case of Molding Pressure Plates in a Body and Providing Grooves:

The pressure plates 4a within a required pressing area are molded in a body and grooves 4ac are provided on the surface thereof as shown in FIG. 12. Although only grooves 4ac in the direction vertical to the drawing are shown in FIG. 12, similar grooves are provided also in the direction parallel to the drawing. According to the present case, the grooves 4ac have a low rigidity and are deformable even though there is only one pressure plate 4a, so that the direction of each pressing area separated by the grooves 4ac may be changed in correspondence to the irregularity of the wafer. Accordingly, the same effect as the case in FIGS. 2 and 3 may be obtained.

Figure 13:
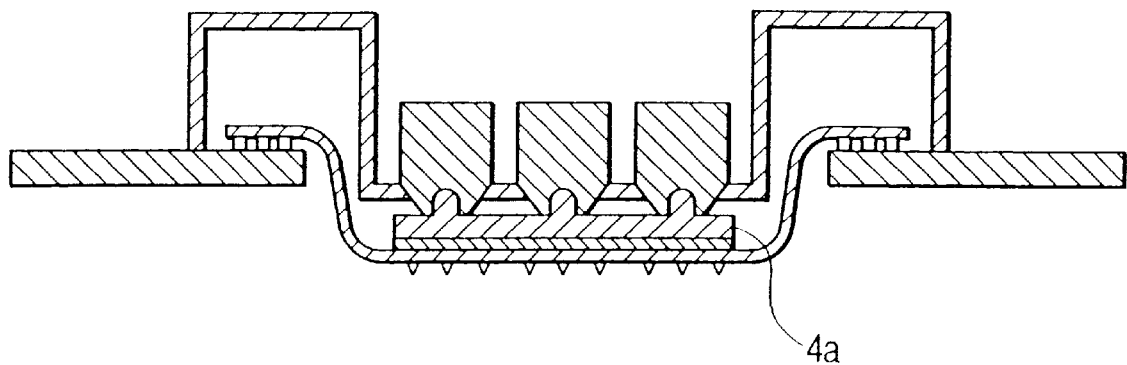
FIG. 13 is a side sectional view showing one example of the probe unit used in semiconductor device manufacturing steps according to one embodiment of the present invention.

A7. Case of Molding Pressure Plates in a Body by a Member Having a Low Rigidity:

The pressure plate 4a within a required pressing area is molded in a body by a member having a low rigidity as shown in FIG. 13. According to the present case, the pressure plate may deform more continuously, i.e., more faithfully, relative to the irregularity of the wafer as compared to the above-mentioned cases, so that it is more effective in reducing the dispersion of the load.

Figure 14:
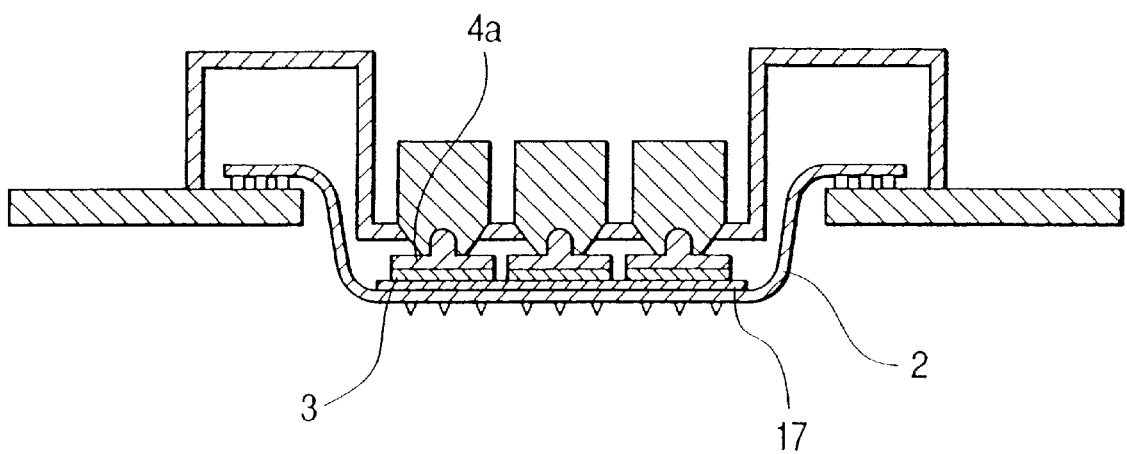
FIG. 14 is a side sectional view showing one example of the probe unit used in semiconductor device manufacturing steps according to one embodiment of the present invention.

A8. Case of Enhancing the Rigidity of the Membrane:

A membrane 17 made of Cu is bonded on the surface of the membrane 2, as shown in FIG. 14, to enhance the rigidity of the membrane 2 in macro. It works as complementary means for realizing the applied case A3 described above. The Cu membrane 17 may serve also as a ground plane for enhancing high-frequency characteristics of the membrane. Its position need not be limited to the center part of the membrane. Although the elastomer 3 is interposed only between the pressure plate 4a and the Cu membrane 17 in FIG. 14, it may be provided between the membrane 2 and the Cu membrane 17, or be provided at both places. Further, the material of the Cu membrane 17 shown here is not limited only to Cu, and non-conductor, such as a resin, may be used if it is not necessary for it to serve as a ground plane for enhancing the high frequency characteristics.

Figure 15:
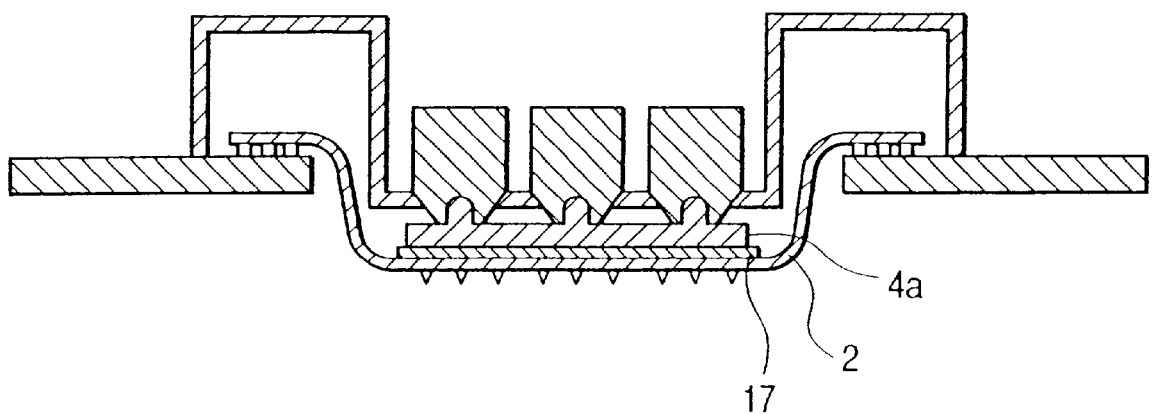
FIG. 15 is a side sectional view showing one example of the probe unit used in semiconductor device manufacturing steps according to one embodiment of the present invention.
Figure 16:
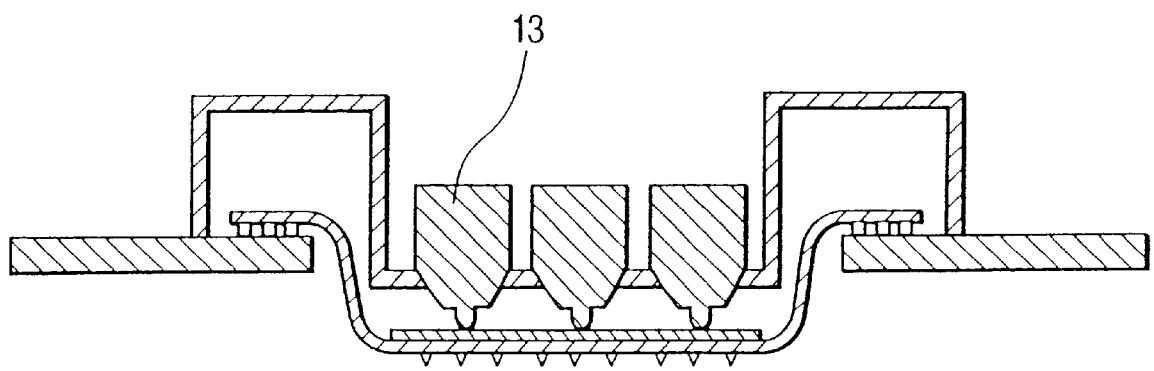
FIG. 16 is a side sectional view showing one example of the probe unit used in semiconductor device manufacturing steps according to one embodiment of the present invention.

Although the interfaces of those members are bonded normally by adhesive, they need not be always bonded as long as their performance is maintained. Further, the elastomer need not be always provided, as shown in FIG. 15. Still more, when the rigidity of the whole membrane is controlled adequately by the above-mentioned means, it is not always necessary to provide the pressure plates for pressing the membrane plan-wise. For instance, it is possible to press the membrane point-wise indirectly or directly using a plurality of weights 13, as shown in FIG. 16. for example.

Figure 17:
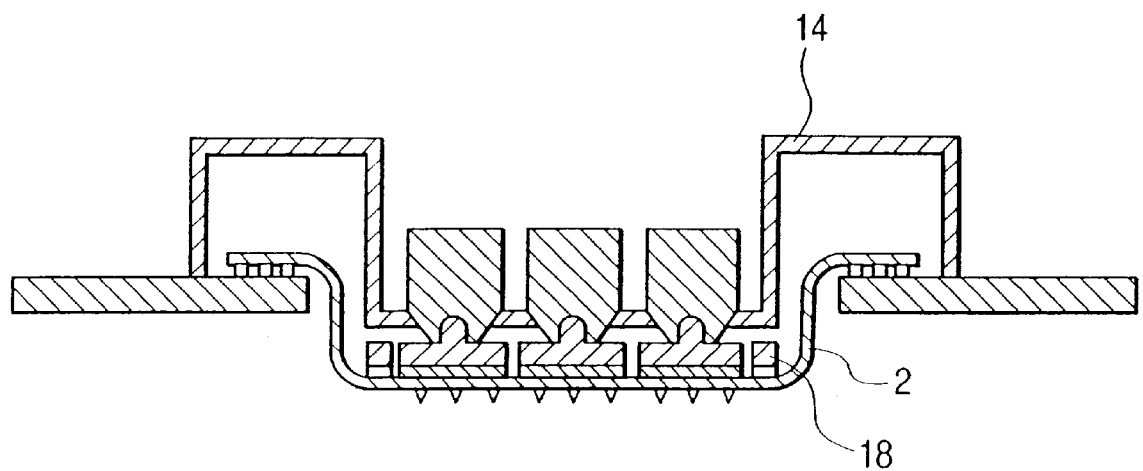
FIG. 17 is a side sectional view showing one example of the probe unit used in semiconductor device manufacturing steps according to one embodiment of the present invention.

B. Case of Improving the Flatness of the Pressing Area:

A frame member 18 having a high rigidity is bonded to the outer periphery of the pressing area, as shown in FIG. 17, to prevent the membrane 2 within the pressing area from sagging or warping. The present case may be carried out in combination with all of the embodiments and applied to applications of the present invention. It is noted that the frame member 18 may be bonded to the main body 14 to enhance the stability.

Figure 18:
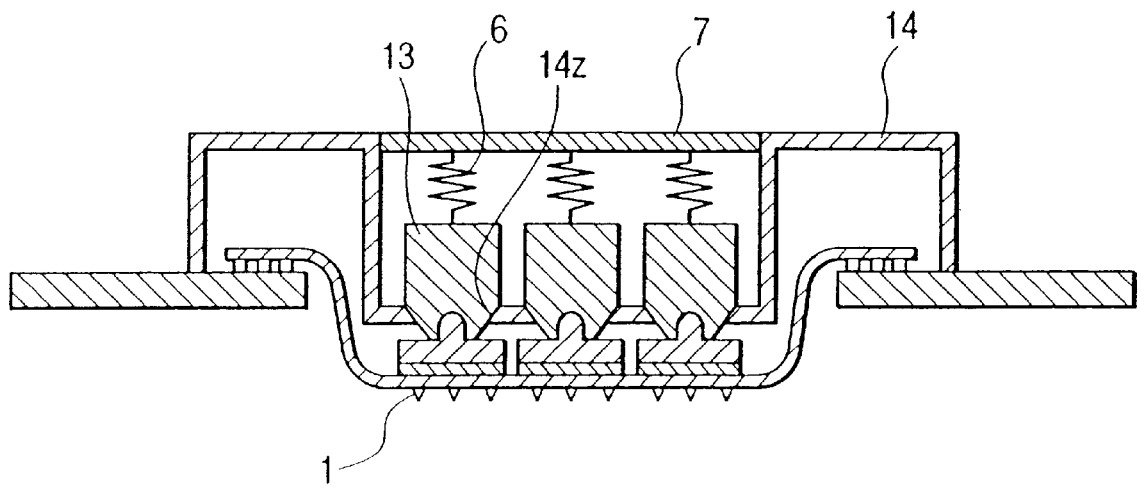
FIG. 18 is a side sectional view showing one example of the probe unit used in semiconductor device manufacturing steps according to one embodiment of the present invention.

C. Case of Adding an Auxiliary Weight Applicator:

A spring 6 is provided above each weight 13 as an auxiliary weight applicator and a fixed member 7 bonded with the main body 14 is provided thereabove, as shown in FIG. 18. The present case is suitable when there are a large number of electrode pads to be pressed as compared to the pressing area of one pressure plate and a sufficient load cannot be applied to all of the probes 1 by using only the weight 13. Normally, a compression coil spring is used for the spring 6. It is desirable for the spring to be fully compressed in the initial state. However, the spring 6 is not limited only to a compression coil spring, and various elastic bodies which generate a suitable load through deformation may be employed for this purpose.

When the position of each weight 13 and others is accurately defined by suitably disposing the fixed member 7, the counter bore 14z of the main body 14 shown in FIG. 2 and others may be omitted. Further, when it is determined that the dispersion of the load shown in Table 1 is small, the weight 13 may be omitted and the pressure plate 4a may be mechanically connected with the spring 6 in the present case.

The present case may be carried out by combining all of the embodiments and applied cases of the present invention similarly to the applied case B.

Figure 19:
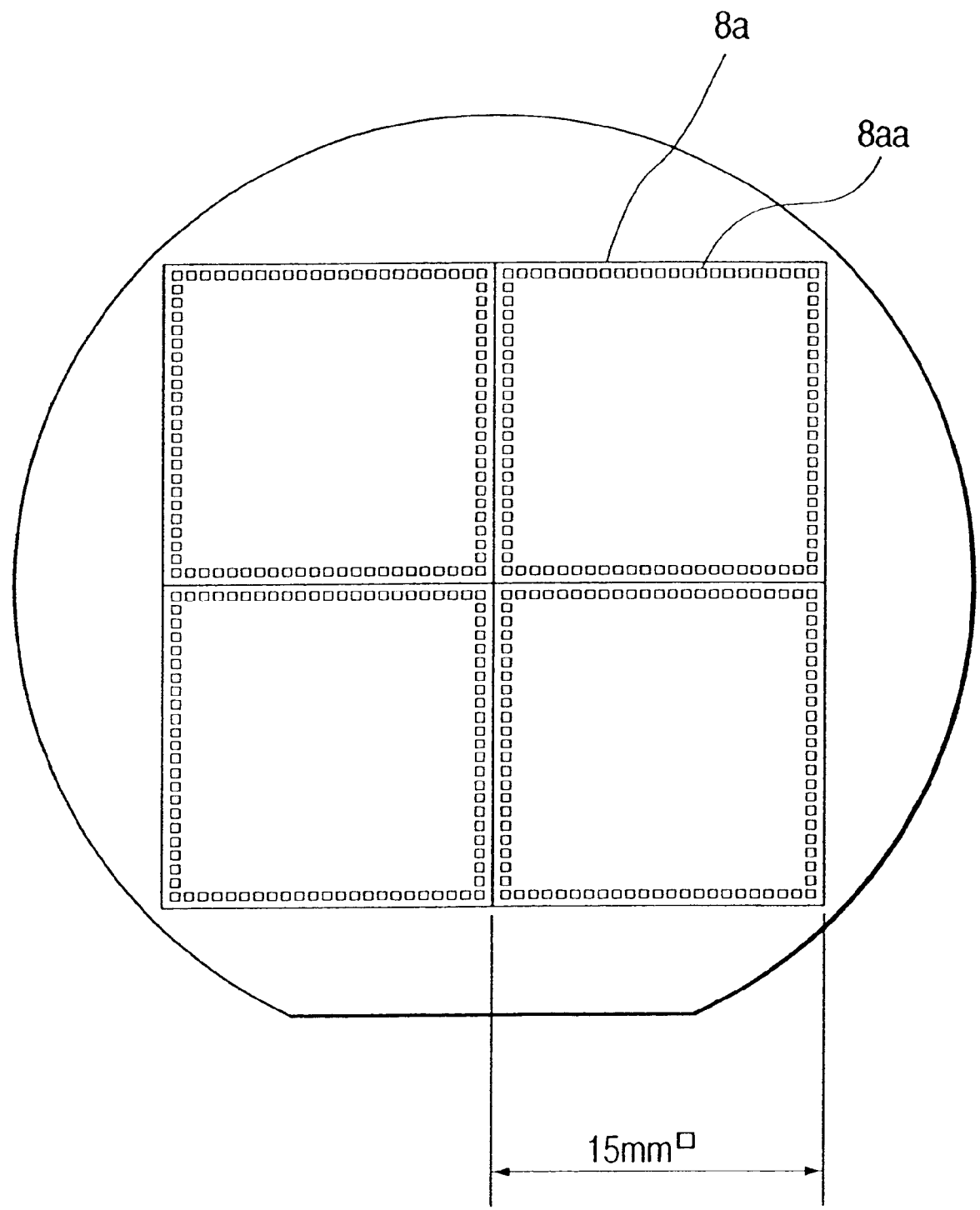
FIG. 19 is a top plan view of a wafer showing one example of the disposition of integrated circuits within the wafer and the electrode pads within the integrated circuits.
Figure 20:
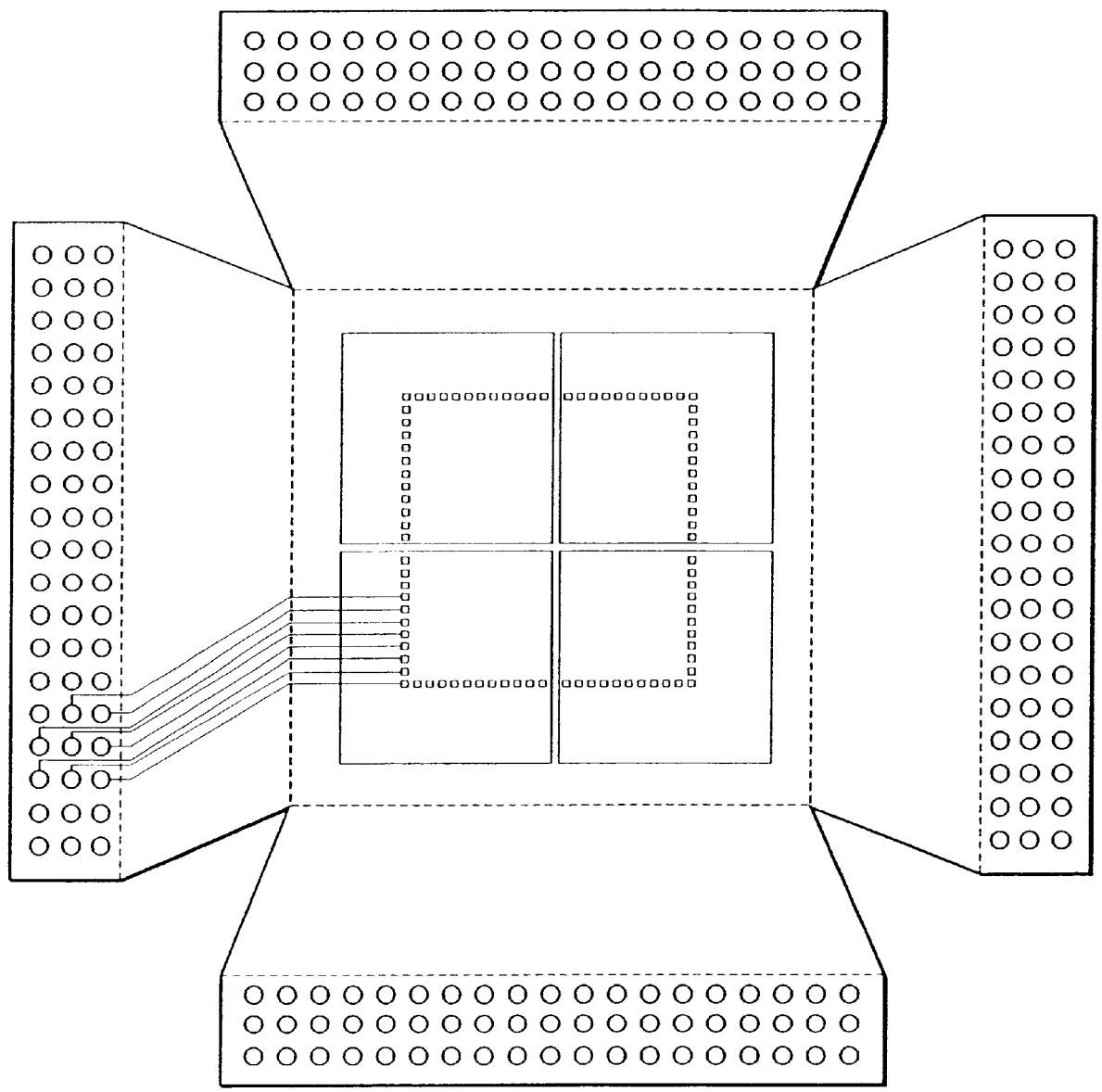
FIG. 20 is a top plan view showing one example of a membrane for a probe unit for pressing against the wafer in FIG. 19 according to one embodiment of the present invention.

D. Case of Accommodating the Probing of a Large Integrated Circuit:

This is a case of probing a wafer on which large integrated circuits, whose one side is as long as 15 mm or more and which has several hundreds of electrode pads 8aa per integrated circuit, are formed as shown in FIG. 19. A plurality of pressure plates are disposed in correspondence to the size of the integrated circuits as shown in FIG. 20. The present case is employed when the size of one integrated circuit exceeds an allowable shape of the pressure plate. According to the present case, the integrated circuits may be probed in batch even if their size is very large by adequately arranging the shape, disposition and number of pressure plates.

Figure 21:
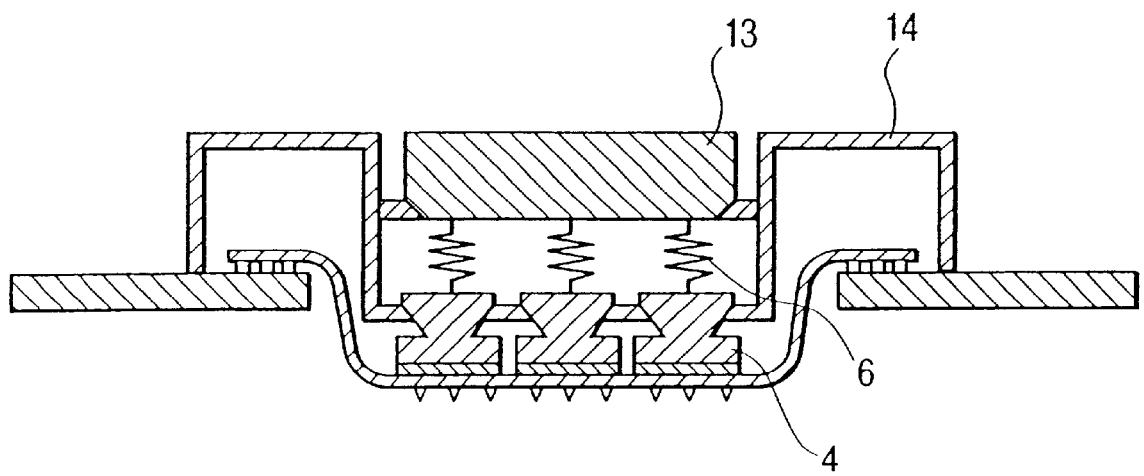
FIG. 21 is a side sectional view showing one example of the probe unit used in semiconductor device manufacturing steps according to one embodiment of the present invention.

E. Case of Providing a Plurality of Points of Application of Load in One Weight:

The respective pressure plates 4 are mechanically connected with the weight 13 above them by springs 6 as shown in FIG. 21. The weight 13 engages with the counter bore of the main body 14 in the normal state so that the static position and attitude thereof are stabilized. When probing is carried out in this arrangement, each spring 6 deforms independently corresponding to the displacement of each pressure plate and the weight moves upward when the energy produced by the deformation reaches above the dead weight of the weight 13.

The use of this arrangement allows not only the structure itself to be simplified, but also allows a larger (heavier) weight to be provided because it is not necessary to accommodate the size of the weight 13 in the wafer plane direction to the size of the pressure plate. Further, because it is capable of corresponding to the irregularity of the surface of the wafer more flexibly, it works effectively even with an irregularity on the surface of the wafer which cannot be absorbed by the spring 6 by using a flexible material for the weight 13.

Figure 22:
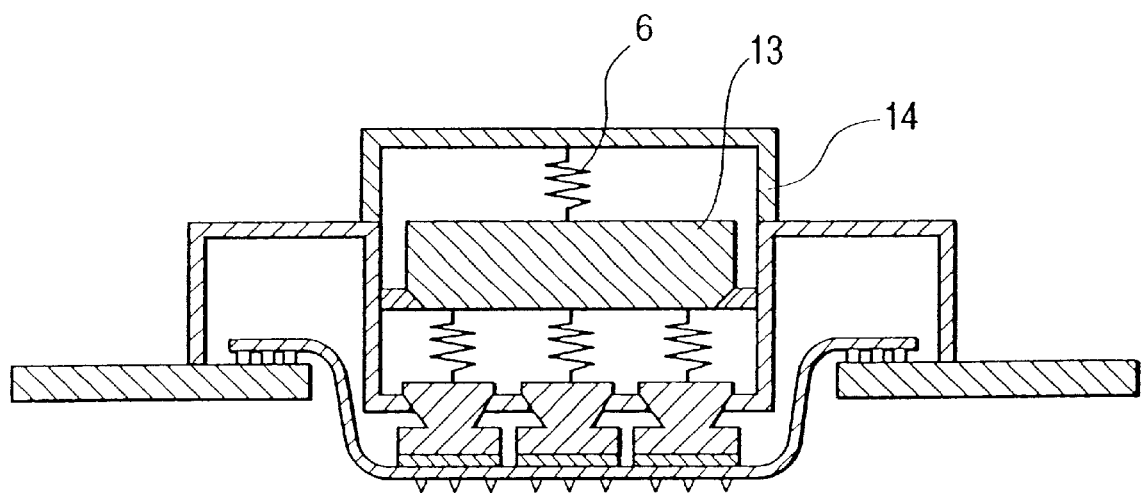
FIG. 22 is a side sectional view showing one example of the probe unit used in semiconductor device manufacturing steps according to one embodiment of the present invention.

FIG. 22 shows a case in which another spring 6 is provided above the weight 13 in addition to the arrangement shown in FIG. 21 and an upper end thereof is fixed mechanically to the main body 14. This case allows enough load to be generated by the spring 6 above the weight 13 even if the weight of the weight 13 does-not meet with a required value due to a dimensional restriction of the structure of the unit.

[Burn-In Inspection Step]

Each probe is contacted with the electrode pad also in this step by the same method as used in the probe test step, so that a detailed explanation of the structure of the system will be omitted here.

Because this burn-in test allows chips including an initial failure caused by thermal stress in the state of wafer to be eliminated, it is possible to avoid the chips including the initial failure from being packaged and to prevent useless cost from being generated.

Further, because this burn-in test allows semiconductor devices to be tested in the wafer state, they can be tested with a smaller heating furnace and a smaller quantity of heat as compared to the known type of heating of packaged semiconductor devices while attaching a socket to the external terminal thereof.

[Dicing Step]

The wafer which has gone through the burn-in test step is cut into a plurality of chips.

It is noted that if integrated circuit protecting members/external connection terminals are mounted on the integrated circuit forming plane of the wafer at the point of time when the probe test step and the burn-in test step have been finished, the final product of the semiconductor devices may be obtained by this dicing step.

Further, this step may be carried out before the probe test step and the burn-in test step by attaching scatter preventing means such as a pressure sensitive adhesive tape on the plane at the opposite side from the circuit forming plane of the wafer so that each chip will not scatter after the dicing step. This method allows a problem, that circuits on the wafer short via the silicon substrate, to be eliminated and the yield to be improved further. It is noted that although this method has problems in that a scatter preventing means, such as a pressure sensitive adhesive tape, has to be attached on the plane at the opposite side from the circuit forming plane of the wafer and that the flatness of the wafer is damaged by dicing, the circuits may be tested without trouble by the probe test step and the burn-in test step of the present embodiment because the probes are firmly pressed to the respective diced circuits.

Defective chips are removed from the large number of chips diced in the above-mentioned step and external connection terminals and others are mounted to the respective non-defective chips to form semiconductor devices.

It is noted that if the integrated circuit protecting members/external terminal attaching members connection are provided and the external connection terminals are mounted on the integrated circuit forming plane of the wafer at the point of time when the probe test step and the burn-in test step have been finished, this step is not necessary.

Although the case of carrying out the dicing step after completion of the probe test step and the burn-in test step has been described in the foregoing embodiments, the same effect as the present embodiment may be obtained also in the conventional manufacturing method by implementing the probe test step/burn-in test step of the present embodiment Accordingly, the present invention can provide semiconductor devices and manufacturing method which allow the dispersion of the load to be kept within a predetermined allowance even if probes in a large area are pressed in batch, and which allow the reliability and productivity of the integrated circuits to be enhanced by probing a large number of integrated circuits or large integrated circuits at the same time.

Further, the present invention can provide semiconductor devices and a manufacturing method which allow the productivity to be enhanced by not packaging chips including an initial failure and by omitting the burn-in test step.

While various preferred embodiments have been described, variations thereto will occur to those skilled in the art within the scope of the present inventive concepts which are delineated by the following claims.

We claim:

1. A semiconductor wafer inspection device comprising:
    a plurality of probes to electrically contact a number of integrated circuits on a wafer;
    a membrane having a main surface on which said probes are located; and
    a plurality of pressure members located on an opposite surface of said membrane from said main surface;
    wherein said membrane is applied with separate pressure loads at different locations on said membrane by said plurality of pressure members.

* * * * *